(12) United States Patent
Abarra

(10) Patent No.: US 11,220,741 B2
(45) Date of Patent: Jan. 11, 2022

(54) FILM FORMING APPARATUS AND FILM FORMING METHOD

(71) Applicant: Tokyo Electron Limited, Tokyo (JP)

(72) Inventor: Einstein Noel Abarra, Tokyo (JP)

(73) Assignee: TOKYO ELECTRON LIMITED, Tokyo (JP)

(*) Notice: Subject to any disclaimer, the term of this patent is extended or adjusted under 35 U.S.C. 154(b) by 146 days.

(21) Appl. No.: 16/412,573

(22) Filed: May 15, 2019

(65) Prior Publication Data

US 2019/0352771 A1    Nov. 21, 2019

(30) Foreign Application Priority Data

May 16, 2018    (JP) .............................. JP2018-094400

(51) Int. Cl.
| C23C 14/50 | (2006.01) |
| H01L 21/02 | (2006.01) |
| C23C 14/54 | (2006.01) |
| C23C 14/34 | (2006.01) |
| H01J 37/32 | (2006.01) |

(52) U.S. Cl.
CPC ........ *C23C 14/505* (2013.01); *C23C 14/3407* (2013.01); *C23C 14/3464* (2013.01); *C23C 14/54* (2013.01); *H01J 37/32715* (2013.01); *H01L 21/02631* (2013.01)

(58) Field of Classification Search
None
See application file for complete search history.

(56) References Cited

U.S. PATENT DOCUMENTS

| 4,858,556 | A | * | 8/1989 | Siebert | .................... C23C 14/54 |
| | | | | | 118/664 |
| 2002/0064595 | A1 | * | 5/2002 | Nomura | ................. B82Y 10/00 |
| | | | | | 427/131 |
| 2005/0003196 | A1 | * | 1/2005 | Smith | .................. C23C 14/505 |
| | | | | | 428/409 |
| 2011/0293835 | A1 | * | 12/2011 | Lavi | ...................... C23C 14/044 |
| | | | | | 427/282 |
| 2017/0111022 | A1 | * | 4/2017 | McCarron | ........... H01J 37/3408 |

FOREIGN PATENT DOCUMENTS

| JP | 2015-067856 A | 4/2015 |
| JP | 2005-187830 A | 7/2015 |

* cited by examiner

*Primary Examiner* — Jason Berman
(74) *Attorney, Agent, or Firm* — Abelman, Frayne & Schwab

(57) ABSTRACT

A film forming apparatus includes: a processing chamber; a sputtered particle emitter; a substrate mounting unit; and a sputtered particle shielding plate that is provided between the sputtered particle emitter and the substrate mounting unit and has a passage hole that allows the sputtered particles emitted from the sputtered particle emitter to pass through and allows the sputtered particles to be obliquely incident on a substrate mounted on the substrate mounting unit.

9 Claims, 3 Drawing Sheets

FILM FORMING APPARATUS AND FILM FORMING METHOD

CROSS-REFERENCE TO RELATED APPLICATIONS

This application is based on and claims priority from Japanese Patent Application No. 2018-094400 filed on May 16, 2018 with the Japan Patent Office, the disclosure of which is incorporated herein in its entirety by reference.

TECHNICAL FIELD

The present disclosure relates to a film forming apparatus and a film forming method.

BACKGROUND

In manufacturing electronic devices such as semiconductor devices, a film forming process that forms a film on a substrate is performed. A sputtering apparatus is known as a film forming apparatus that is used for the film forming process.

In Japanese Patent Laid-open Patent Publication No. 2015-067856, a technique that makes sputtered particles to be obliquely incident on a substrate (hereinafter, referred to as "oblique film forming") has been proposed as a technique for implementing a film forming having high directivity in which an incident direction of sputtered particles is aligned with respect to a pattern on the substrate.

A film forming apparatus disclosed in Japanese Laid-Open Patent Publication No. 2015-067856 includes a vacuum container, a substrate holding table provided in the vacuum container, a target holder that holds a target, and a shielding assembly that is provided between the target holder and the substrate holding table and has an opening (passage hole). Then, the oblique film forming is implemented by passing the sputtered particles emitted from the target through the opening of the shielding assembly and making the sputtered particles to be incident on the substrate at a predetermined angle, while linearly moving the substrate holding table by a moving mechanism.

SUMMARY

A film forming apparatus according to the present disclosure includes: a processing chamber that defines a processing space in which a film forming process on a substrate is performed; a sputtered particle emitter configured to emit sputtered particles in the processing space; a substrate mounting unit provided in the processing space and configured to mount a plurality of substrates thereon; and a sputtered particle shielding plate provided between the sputtered particle emitter and the substrate mounting unit and having a passage hole that allows the sputtered particles emitted from the sputtered particle emitter to pass therethrough, thereby causing the sputtered particles to be obliquely incident on a substrate mounted on the substrate mounting unit. The substrate mounting unit includes: a plurality of mounting stages on which a plurality of substrates are mounted, respectively; a base having a circular shape in a plan view and configured to rotatably support the plurality of mounting stages; a base driver configured to rotate the base such that the plurality of mounting stages revolve; and a stage driver configured to rotate the plurality of mounting stages relative to the base such that the plurality of mounting stages are maintained in the same planar direction, when the base is rotated by the base driver to revolve the plurality of mounting stages.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, exemplary embodiments of the present disclosure will be described in detail with reference to the drawings.

Figure 1:
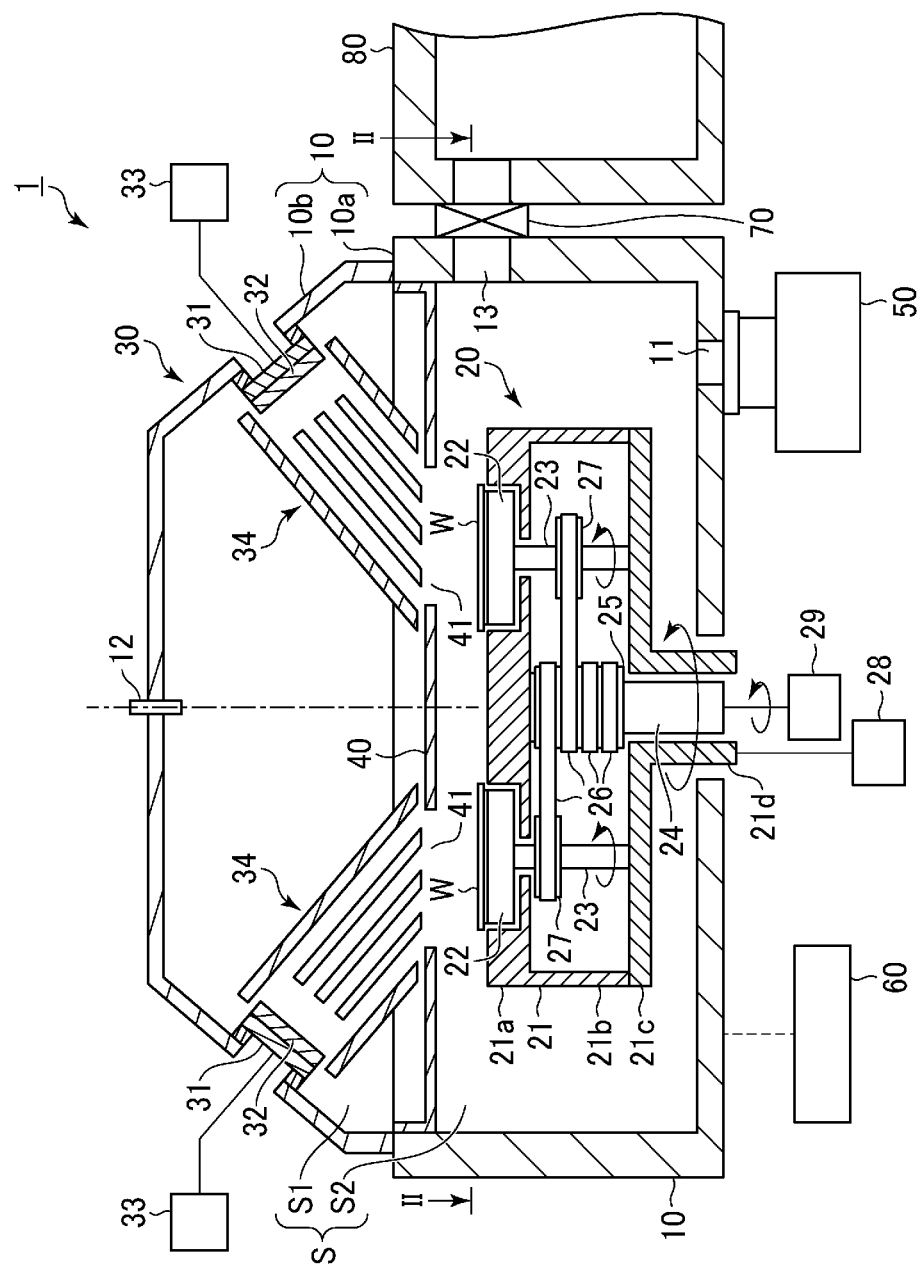
FIG. 1 is a longitudinal sectional view illustrating a film forming apparatus according to an embodiment.
Figure 2:
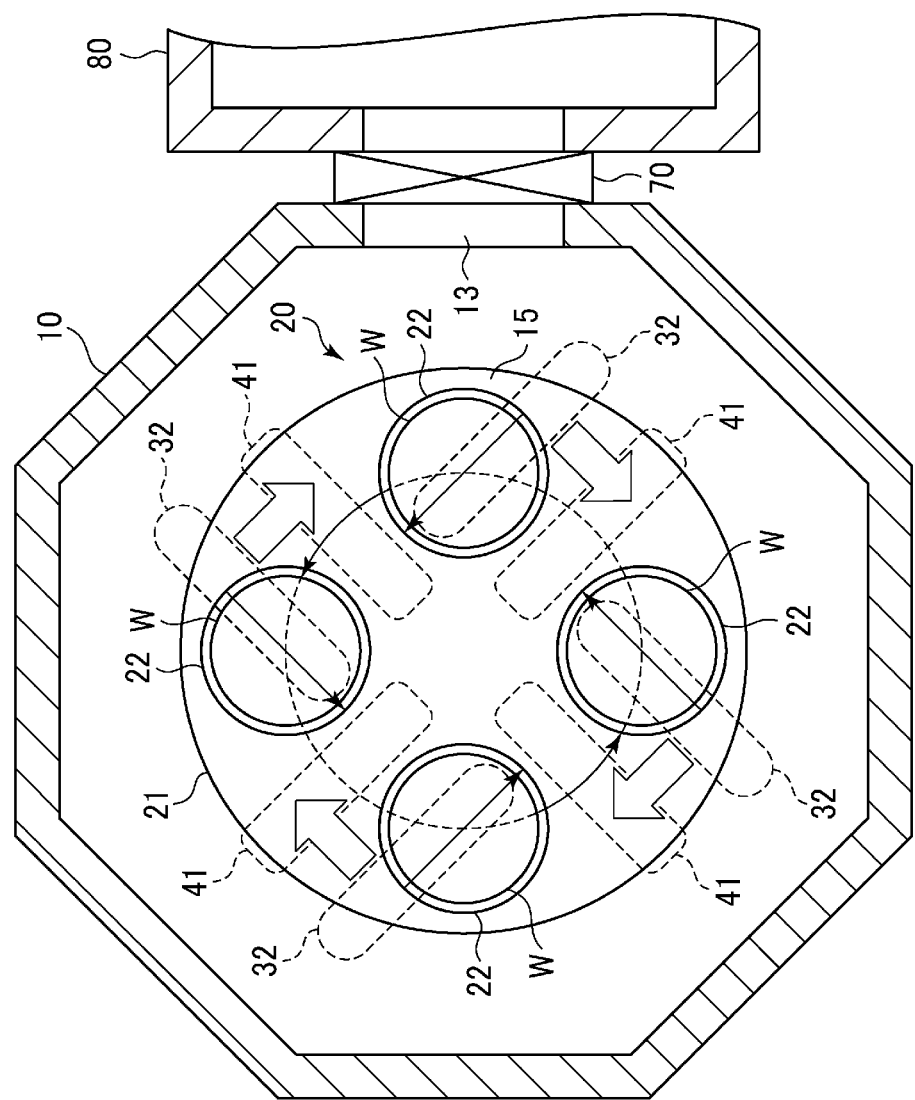
FIG. 2 is a horizontal sectional view taken along line II-II in FIG. 1.

FIG. 1 is a longitudinal sectional view illustrating a film forming apparatus according to an embodiment, and FIG. 2 is a horizontal sectional view taken along line II-II in FIG. 1.

A film forming apparatus 1 forms a film on a substrate W by sputtering, and includes a processing chamber 10, a substrate mounting unit 20, a sputtered particle emitter 30, a sputtered particle shielding plate 40, an exhaust device 50, and a controller 60.

The processing chamber 10 includes a chamber body 10a that is opened at its upper portion, and a cover 10b that is provided so as to close the upper opening of the chamber body 10a. The inside of the processing chamber 10 is a processing space S in which a film forming processing is performed.

An exhaust port 11 is formed at the bottom of the processing chamber 10, and the exhaust device 50 is connected to the exhaust port 11. The exhaust device 50 includes a pressure control valve and a vacuum pump, and the processing space S is evacuated to a predetermined vacuum degree by the exhaust device 50.

A gas introducing port 12 is inserted at a top portion of the processing chamber 10 to introduce a gas into the processing space S. A gas, for example, an inert gas from a gas supply (not illustrated) is introduced into the processing space S from the gas introducing port 12.

A carrying-in/out port 13 for carrying-in/out the substrate W is formed on the side wall of the processing chamber 10. The carrying-in/out port 13 is opened/closed by a gate valve 70. The processing chamber 10 is provided to be adjacent to a conveying chamber 80, and the processing chamber 10 and the conveying chamber 80 are communicated with each other by opening the gate valve 70. The inside of the conveying chamber 80 is maintained in a vacuum atmosphere, and a conveying device (not illustrated) is provided therein to carry the substrate W into/out from the processing chamber 10.

The substrate mounting unit 20 includes a base 21, and a plurality of (four in this example) mounting stages 22 for mounting the substrate W arranged inside the base 21.

The base 21 has a circular shape in a plan view, and is formed in a cylindrical shape, which includes an upper plate 21a, a side wall portion 21b, a lower plate 21c, and a hollow rotating shaft 21d that extends vertically downward from a center portion of the lower plate 21c. The hollow rotating shaft 21d extends below the processing chamber 10 and is connected to a first driving mechanism 28. Thus, the base 21 may be rotated by the first driving mechanism 28.

The plurality of mounting stages 22 are circumferentially arranged at same intervals, and are rotatably provided in recesses formed in the upper plate 21a of the base 21. Each of the mounting stages 22 is supported by a mounting stage rotating shaft 23 that extends upward from the lower plate 21c of the base 21. A plurality of mounting stage rotating shafts 23 are rotatably connected to the lower plate 21c, and driven pulleys 27 are fixed to each of the mounting stage rotating shaft 23, respectively. All of the plurality of (four) driven pulleys 27 have the same diameter.

A rotating shaft 24 that extends vertically is provided inside the hollow rotating shaft 21d, and an upper portion of the rotating shaft 24 is rotatably connected to the upper plate 21a. The rotating shaft 24 extends below the processing chamber 10 and is configured to be rotated by the second driving mechanism 29. A driving pulley 25 is fixed to the upper portion of the rotating shaft 24. Driving belts 26 are wound on the driving pulley 25 and the plurality of driven pulleys 27, respectively, and a power transmission mechanism is constituted by the driving pulley 25, the driven pulleys 27, and the driving belts 26.

When the base 21 is rotated by the first driving mechanism 28 while the second driving mechanism 29 is stopped, the plurality of mounting stages 22 revolve on the rotation of the rotating shaft 24 in a state where a relative movement with the base 21 occurs while maintaining the same planar direction. As a result, while the plurality of substrates W mounted on the plurality of mounting stages are in the same direction, the substrates W may pass below the passage hole 41. This is because the rotating shaft 24 is not rotating, so that rotation via the driving belt 26 does not occur on the mounting stage 22. That is, the second driving mechanism 29 and the power transmission mechanism constitute a mechanism that maintains the mounting stage 22 in the same planar direction when the base 21 is rotated by the first driving mechanism 28.

Further, when the rotating shaft 24 is rotated by the second driving mechanism 29, power is transmitted to the plurality of driven pulleys 27 via the driving pulley 25 and the driving belts 26, so that the plurality of mounting stages 22 are rotated via the plurality of mounting stage rotating shaft 23. At this time, since all of the driven pulleys 27 have the same diameter, the plurality of mounting stages 22 are synchronized and rotated at the same rotation angle. Further, since the mounting stage rotating shaft 23 is rotatable with respect to the lower plate 21c of the base 21 and the rotating shaft 24 is rotatable with respect to the upper plate 21a, the mounting stage 22 is rotatable independently of the base 21.

A gear mechanism may be used as a power transmission mechanism instead of the driving belt as described above. In this case, a single first gear may be fixed to the rotating shaft 24, and second gears having the same number of teeth may be fixed to the plurality of mounting stage rotating shaft 23, thereby causing the first gear and the second gears to be engaged.

As illustrated in FIG. 2, a substrate delivery unit 15 is provided in the vicinity of the carrying-in/out port 13 in the rotating region of the base 21. The substrate delivery unit 15 includes a substrate lifting unit (not illustrated) that has a plurality of lifting pins, and is configured to deliver the substrate W between a conveying device (not illustrated) and the plurality of mounting stages 22, by raising and lowering the lifting pins in the substrate delivery unit 15, while rotating the base 21 intermittently.

The sputtered particle shielding plate 40 is provided inside the processing chamber 10. The sputtered particle shielding plate 40 is configured as a substantially plate-shaped member, and is arranged horizontally at an intermediate position in the height direction of the processing space S. An edge of the sputtered particle shielding plate 40 is fixed to the side wall of the chamber body 10a. The sputtered particle shielding plate 40 divides the processing space S into a first space S1 and a second space S2. The first space S1 is an upper space of the sputtered particle shielding plate 40, and the second space S2 is a lower space of the sputtered particle shielding plate 40.

The plurality of passage holes 41 through which the sputtered particles pass are formed at the sputtered particle shielding plate 40. The passage holes 41 penetrate the sputtered particle shielding plate 40 in a plate thickness direction (Z direction in FIG. 1). The number of the passage holes 41 is the same as the number of stages (four in this example). The plurality of passage holes 41 have a same shape that is an elongated shape, and are radially formed about a position substantially corresponding to the rotating shaft 24. The plurality of passage holes 41 that are radially formed have the same intervals, and when the number of the passage holes 41 is n, the angle between the adjacent passage holes 41 is $(360/n)°$. In this example, since the number of the passage holes 41 is four, the angle between the adjacent passage holes 41 is 90°. The passage hole 41 is formed such that the longitudinal direction thereof is substantially perpendicular to the passage direction of the substrate W. The length of the passage hole 41 is longer than the diameter of the substrate W, and thus, the sputtered particles may pass through the entire passage hole 41.

The sputtered particle emitter 30 is provided in the cover 10b at the upper portion of the processing chamber 10. The sputtered particle emitter 30 includes a plurality of target holders 31. A target holder 31 is arranged on the upper side of the sputtered particle shielding plate 40, is formed of a conductive material, and is attached to the cover 10b of the processing chamber 10 via an insulating member. The target holder 31 is configured to hold a target 32 in the first space S1. The target 32 is made of a material that contains a constituent element of the film to be formed, and may be a conductive material or a dielectric material.

A power supply 33 is electrically connected with the target holder 31. The power supply 33 may be a DC power supply in the case where the target 32 is made of a conductive material, and may be a radio-frequency power supply in the case where the target 32 is made of a dielectric material. When the power supply 33 is the radio-frequency power supply, the power supply 33 is connected to the target holder 31 via a matching device. By applying voltage to the target holder 12, the gas is dissociated around the target 32. Then, ions in the dissociated gas collide with the target 32, so that sputtered particles, which are particles of the constituent material of the target 32, are emitted from the target 32.

The number of the target holders 31 is the same as the number of the plurality of passage holes 41, and each of the target holders 31 is provided at a position corresponding to each of the passage holes 41. That is, one target holder 31 and one passage hole 41 make a pair, and each target holder 31 holds each target 32 such that the target 32 is positioned obliquely above to the corresponding passage hole 41. In present example, each of four target holders 31 is arranged to make a pair with the corresponding passage hole 41 obliquely above the respective passage holes 41, above the four passage holes 41 arranged radially.

Then, the plurality of target holders 31 holds the target 32 at such a position where the sputtered particles that are emitted from the plurality of target 32 and pass through the corresponding passage holes 41 are incident on the substrate W at the same angle. At this time, the target 32 is longer than the passage hole 41 and has an elongated shape. The target 32 is arranged in parallel with the passage hole 41. Further, the target 32 may be installed such that the surface angle thereof has an inclination of 0° to 90° with respect to the surface of the substrate W. The sputter film formation may be efficiently performed by obliquely installing the target. The incident angle of the sputtered particles to the substrate W may be a range of 20° to 50°.

Between the target holder 31 and the corresponding passage hole 41, a collimator 34 serving as a guide for the sputtered particles is provided to enhance the controllability of the incident angle of the sputtered particles that pass through the passage hole 41 to the substrate W. However, depending on the positional relationship between the target 32 and the passage hole 41, the collimator 34 is not always necessary.

As described above, the sputtered particle emitter 30 has a special three-dimensional structure because the targets 32 are required to be arranged as illustrated in FIG. 2 in correspondence to the passage holes 41 that are radially arranged. Therefore, the actual cross-sectional shape of the sputtered particle emitter 30 is complicated, but in FIG. 1, a schematic cross-section is illustrated for convenience, in order to facilitate understanding.

The controller 60 is constituted by a computer that includes a main controller constituted by a CPU that controls each component, for example, the power supply 33, the exhaust device 20, the first driving mechanism 28, and the second driving mechanism 29, of the film forming apparatus 1, an input device such as a keyboard and a mouse, an output device, a display device, and a storage device. By setting a storage medium that stores a processing recipe in the storage device, the main controller of the controller 60 causes the film forming apparatus 1 to execute a predetermined operation based on the processing recipe loaded from the storage medium.

Subsequently, the operation of the film forming apparatus that is configured as described above will be explained.

Firstly, after exhausting the processing space S in the processing chamber 10, for example, an inert gas is introduced to the processing space S from the gas introducing port 12 to adjust the pressure to a predetermined pressure.

Subsequently, the gate valve 70 is opened to carry the substrate W into the chamber 10 by the conveying device in the conveying chamber 80, and the substrate W is mounted on the plurality of substrate mounting stages 22 by the substrate delivery unit 15. At this time, the delivery of the substrate W to the mounting stage 22 is performed by using the substrate lifting unit (not illustrated) that includes the plurality of lifting pin in the substrate delivery unit 15, while rotating the base 21 intermittently. When the mounting of the substrate W on all of the mounting stages 22 is completed, the conveying device is retracted and the gate valve 70 is closed.

Subsequently, the sputtered particles are emitted from the target 32 by supplying power from the power supply 33 to the target holder 31 in a state where the second driving mechanism 29 is stopped while the base 21 is rotated by the first driving mechanism 28. The target 32 has an elongated shape, and the target particles are obliquely guided by the collimator 34 while maintaining the elongated shape, passes through the passage hole 41 formed in parallel with the target 32, and is irradiated to the moving path of the substrate W. Then, by the rotation of the base 21, the substrate W on the plurality of mounting stages 22 pass below the corresponding passage hole 41, and the sputtered particles are irradiated to the substrate W at this time.

Figure 3:
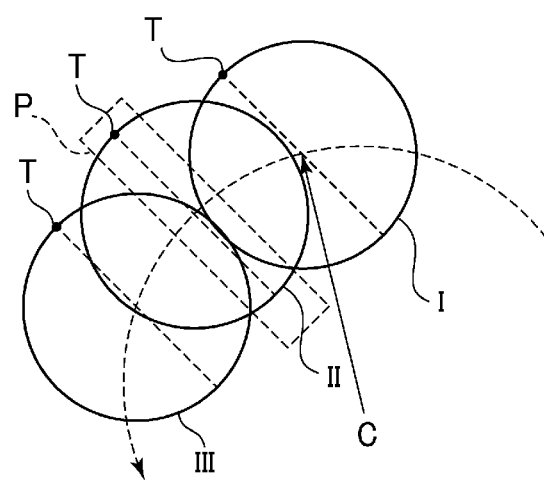
FIG. 3 is a view for explaining a status of a substrate in case where oblique film forming is performed by the film forming apparatus according to the embodiment.

At this time, since the second driving mechanism 29 is stopped, the mounting stage 22 rotates relative to the base 21 without rotating following the base 21, and revolves while maintaining the same planar direction. Therefore, as illustrated in FIG. 3, the substrate W moves from I to II, and to III in FIG. 3, and passes through the elongated irradiation region P of the sputtered particles below the passage hole 41 while maintaining the substantially same planar direction (that is, for example, without changing the position of the vertex T of the substrate W in FIG. 3). As a result, it is possible to irradiate the sputtered particles in the substantially same planar direction over the entire surface W.

The planar direction of the substrate is important in order to perform uniform film forming because the oblique film forming is a film forming that has directivity in which sputtered particles are obliquely incident. Therefore, in Japanese Patent Laid-Open Publication No. 2015-067856, the oblique film forming is implemented by making sputtered particles, which are obliquely irradiated and pass through a passage hole, incident on a substrate while a substrate holding stage is moved linearly by a moving mechanism. The technique in Japanese Patent Laid-Open Publication No. 2015-067856 is substantially limited to a single sheet type, and thus, further throughput improvement has been required.

Meanwhile, in the present embodiment, as described above, the plurality of substrates W are mounted on the plurality of mounting stages 22 that are revolvable, and revolve on the rotation of the rotating shaft 24 in a state where a relative movement to the base 21 occurs while maintaining the mounting stages 22 in the same planar direction. As a result, since the sputtered particles may be obliquely irradiated collectively to the plurality of substrates W in a state where the planar direction of the plurality of substrates W is constant, it is possible to efficiently implement the oblique film forming while securing uniformity.

Further, since the plurality of passage holes 41 are provided radially at same intervals, and the same number of the mounting stages 22 are provided at the same intervals in the base 22, then the plurality of substrates W pass simultaneously below the corresponding passage hole 41 to form a film, respectively, it is possible to more efficiently implement the film forming.

Further, the film forming by the sputtered particles those pass through one passage hole 41 is performed on the substrate W, and when further film forming is continued, the first driving mechanism 28 is stopped, and the plurality of mounting stages 22 are rotated by the second driving mechanism 29. At this time, by operating the second driving mechanism 29, the plurality of mounting stages 22 are synchronized and are rotated at the same rotation angle via the power transmission mechanism by the belt driving (or gear mechanism). That is, the passage holes 41 are radially provided at the same intervals, and when the number of the passage holes 41 is n, the angle between the adjacent passage holes is (360/n)°. Therefore, when the sputtered particles those pass through the subsequent passage hole 41 are irradiated, the mounting stage 22 is rotated by 360°/n by the second driving mechanism 29. In this example, since the number of the passage holes 41 is four, the mounting stage 22 is rotated by (360/4)°, that is 90°. Thereafter, the second driving mechanism 29 is stopped similarly, and the base 21 is rotated by the first driving mechanism 28 and the plurality of mounting stages 22 revolve around the rotating shaft 24 while maintaining the same direction. As a result, the planar direction of the sputtered particles irradiated to the substrate W may be aligned in the same direction as the case of using the former passage hole 41. Therefore, by repeating this, the oblique film forming may be continued on the plurality of substrates W, and thus, the oblique film forming with good uniformity and efficiency may be performed with an arbitrary thickness.

At this time, if there is enough time, the rotation of the mounting stage 22 by the second driving mechanism 29 may be performed without stopping the rotation of the base 21 by the first driving mechanism 28. Further, the mounting stage 22 may be rotated by the second driving mechanism 29 for the purpose of, for example, fine adjustment while the base 21 is rotated by the first driving mechanism 28.

For example, the method of emitting the sputtered particles in the above embodiment is an example, and the sputtered particles may be emitted by other methods.

Further, the number of the mounting stages on which the substrate is mounted is not limited to four as in the above embodiment, and may be two or more.

Furthermore, in the above embodiment, the example in which the number of targets and the passage holes is four that is the same number as the substrates (mounting stages) is described, but the number of the targets and the passage holes is not limited thereto, and may be one or more.

According to the present disclosure, the film forming apparatus and the film forming method are provided that are capable of efficiently forming a film while securing uniformity when implementing the oblique film forming by making the sputtered particles being incident obliquely.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film forming apparatus comprising:
    a processing chamber that defines a processing space in which a film forming process on a substrate is performed;
    a sputtered particle emitter configured to emit sputtered particles in the processing space;
    a substrate mounting unit provided in the processing space and configured to mount a plurality of substrates thereon; and
    a sputtered particle shielding plate provided between the sputtered particle emitter and the substrate mounting unit and having passage holes that allow the sputtered particles emitted from the sputtered particle emitter to pass therethrough, thereby causing the sputtered particles to be obliquely incident on the substrates mounted on the substrate mounting unit,
    wherein the substrate mounting unit includes:
        a plurality of mounting stages on which a plurality of substrates are mounted, respectively;
        a base having a circular shape in a plan view and configured to rotatably support the plurality of mounting stages;
        a base driver configured to rotate the base such that the plurality of mounting stages revolve; and
        a stage driver configured to rotate the plurality of mounting stages relative to the base such that a relative planar direction of each of the plurality of mounting stages with respect to the base is maintained to be constant, when the plurality of mounting stages revolve,
    wherein the stage driver includes a second rotating shaft provided coaxially with a first rotating shaft of the base driver, a shaft driver configured to rotate the second rotating shaft, and a power transmitter configured to transmit rotation of the second rotating shaft to the plurality of mounting stages such that the plurality of mounting stages are synchronously rotated at the same rotation angle, and
    the plurality of mounting stages are rotated relative to the base such that the relative planar direction of each of the plurality of mounting stages with respect to the base is maintained to be constant, by stopping the shaft driver when the plurality of mounting stages revolve.

2. The film forming apparatus according to claim 1, wherein the plurality of mounting stages are provided equidistantly,
    when the number of the mounting stages is n, the number of the passage holes is n, and the n passage holes are formed radially and equidistantly such that an angle of the adjacent passage holes is (360/n°),
    the sputtered particle emitter includes a plurality of target holders that are provided corresponding to the passage holes, respectively, and a sputtered particle emitting device configured to emit the sputtered particles from a plurality of targets that are held by the plurality of target holders, respectively, and
    the sputtered particles that are emitted from the plurality of targets, respectively, pass through the respective corresponding passage holes to be incident on the substrates mounted on the mounting stages at the same angle, respectively.

3. The film forming apparatus according to claim 2, further comprising a controller configured to control the base driver to rotate the base such that the substrates mounted on the plurality of mounting stages pass below the passage holes, respectively while stopping the shaft driver, control the shaft driver to rotate the plurality of mounting stages by (360/n°) while stopping the base driver, and then, control the base driver to rotate the base such that the plurality of substrates pass the subsequent passage holes, respectively while stopping the shaft driver.

4. A film forming method comprising:
    providing a film forming apparatus including:
        a processing chamber that defines a processing space in which a film forming process on a substrate is performed; a sputtered particle emitter configured to emit sputtered particles in the processing space;

a substrate mounting unit provided in the processing space and configured to mount a plurality of substrates thereon and including:
  a plurality of mounting stages on which a plurality of substrates are mounted, respectively,
  a base having a circular shape in a plan view and configured to rotatably support the plurality of mounting stages such that the plurality of mounting stages revolve,
  a base driver configured to rotate the base such that the plurality of mounting stages revolve, and
  a stage driver including a second rotating shaft provided coaxially with a first rotating shaft of the base driver, a shaft driver configured to rotate the second rotating shaft, and a power transmitter configured to transmit rotation of the second rotating shaft to the plurality of mounting stages such that the plurality of mounting stages are synchronously rotated at the same rotation angle; and
  a sputtered particle shielding plate provided between the sputtered particle emitter and the substrate mounting unit, and having passage holes that allow the sputtered particles emitted from the sputtered particle emitter to pass therethrough, thereby causing the sputtered particles to be obliquely incident on the substrates mounted on the substrate mounting unit;
revolving the plurality of mounting stages by rotating the base such that the substrates mounted on the plurality of mounting stages pass below the passage holes; and
rotating the plurality of mounting stages relative to the base such that a relative planar direction of each of the plurality of mounting stages with respect to the base is maintained to be constant while revolving the plurality of mounting stages, by stopping the shaft driver when the plurality of mounting stages revolve.

5. The film forming method according to claim 4, wherein the plurality of mounting stages are provided equidistantly, when the number of the mounting stages is n, the number of the passage holes is n, and the n passage holes are formed radially and equidistantly such that an angle of the adjacent passage holes is $(360/n°)$, the sputtered particle emitter includes a plurality of target holders that are provided corresponding to the passage holes, respectively, and a sputtered particle emitting device configured to emit the sputtered particles from a plurality of target that are held by the plurality of target holders, respectively, and the sputtered particles that are emitted from the plurality of targets, respectively, pass through the respective corresponding passage holes to be incident on the substrates mounted on the mounting stages at the same angle, respectively.

6. The film forming method according to claim 5, further comprising:
  rotating the plurality of mounting stages by $(360/n°)$ while stopping rotation of the base after rotating the base by the revolving the plurality of mounting stages and the rotating the plurality of mounting stages such that the substrates mounted on the plurality of mounting stages pass below the passage holes, respectively; and
  subsequently, performing the revolving the plurality of mounting stages and the rotating the plurality of mounting stages such that the substrates mounted on the plurality of mounting stages pass below each of subsequent passage holes, respectively, by rotating the base.

7. The film forming apparatus according to claim 1, wherein the stage driver further includes a driven pulley that is fixed to the second rotating shaft by each mounting stage, and
  all of a plurality of driven pulleys have the same diameter.

8. The film forming apparatus according to claim 1, wherein each of the passage holes is formed such that a longitudinal direction thereof is substantially perpendicular to a passage direction of the substrate.

9. The film forming apparatus according to claim 2, further comprising:
  a collimator provided between each of the plurality of target holder and a corresponding passage hole and configured to guide the sputtered particles emitted from the plurality of targets, respectively.

* * * * *